United States Patent
Spesser et al.

(10) Patent No.: US 12,246,612 B2
(45) Date of Patent: Mar. 11, 2025

(54) ENERGY SUPPLY SYSTEM

(71) Applicant: Dr. Ing. h.c. F. Porsche Aktiengesellschaft, Stuttgart (DE)

(72) Inventors: Daniel Spesser, Illingen (DE); Tim Pfizenmaier, Leonberg (DE); Florian Mayer, Tamm (DE)

(73) Assignee: Dr. Ing. h.c. F. Porsche, Stuttgart (DE)

( * ) Notice: Subject to any disclaimer, the term of this patent is extended or adjusted under 35 U.S.C. 154(b) by 612 days.

(21) Appl. No.: 17/507,072

(22) Filed: Oct. 21, 2021

(65) Prior Publication Data
US 2022/0144118 A1 May 12, 2022

(30) Foreign Application Priority Data

Nov. 6, 2020 (DE) .................. 10 2020 129 250.3

(51) Int. Cl.
| | |
|---|---|
| *H02J 7/00* | (2006.01) |
| *B60L 53/60* | (2019.01) |
| *B60L 55/00* | (2019.01) |
| *G01R 25/00* | (2006.01) |
| *H02J 7/14* | (2006.01) |

(52) U.S. Cl.
CPC .............. *B60L 53/60* (2019.02); *B60L 55/00* (2019.02); *G01R 25/00* (2013.01)

(58) Field of Classification Search
CPC .......... B60L 53/60; B60L 53/62; B60L 53/63; B60L 53/665; B60L 55/00
USPC .......................................................... 320/134
See application file for complete search history.

(56) References Cited

U.S. PATENT DOCUMENTS

| | | | |
|---|---|---|---|
| 10,239,409 B2 | 3/2019 | Herke | |
| 10,333,336 B2 | 6/2019 | Enthaler et al. | |
| 10,500,967 B2 * | 12/2019 | Spesser | ................... B60L 53/14 |
| 10,938,211 B2 | 3/2021 | Bell | |

(Continued)

FOREIGN PATENT DOCUMENTS

| | | |
|---|---|---|
| CN | 107612044 | 1/2018 |
| CN | 108501841 | 9/2018 |

(Continued)

OTHER PUBLICATIONS

Chinese Final Office Action dated Jul. 21, 2023.
Chinese Search Report dated Jul. 18, 2023.
Korean Preliminary Rejection.

*Primary Examiner* — Alexis B Pacheco
(74) *Attorney, Agent, or Firm* — Gerald E. Hespos; Michael J Porco

(57) ABSTRACT

An energy supply system has a switch, which in an on state connects first conductors of a first line to second conductors of a second line and in an off state disconnects the first conductors of the first line from the second conductors of the second line. A measurement apparatus determines a difference value characterizing the phase difference between a first AC voltage signal at one first conductor and a second AC voltage signal at one second conductor. A control apparatus outputs a command via a signal transmission apparatus depending on the phase difference value. The first command enables a vehicle connected to the charging station to change the phase position of a fed-in AC voltage signal in the feed-in mode to reduce the phase difference, and the control apparatus enables a first change of state of the switch from the off state to the on state.

10 Claims, 2 Drawing Sheets

(56) References Cited

U.S. PATENT DOCUMENTS

| | | | |
|---|---|---|---|
| 10,940,766 B2 | 3/2021 | Spesser | |
| 11,217,996 B2 | 1/2022 | Lehn et al. | |
| 11,226,239 B2 | 1/2022 | Zoon et al. | |
| 2015/0015188 A1* | 1/2015 | Ono | H02J 3/322 |
| | | | 320/107 |
| 2016/0185241 A1 | 6/2016 | Kinomura | |
| 2016/0266559 A1 | 9/2016 | Shi et al. | |
| 2017/0358960 A1* | 12/2017 | Percebon | H02J 50/80 |
| 2018/0375338 A1 | 12/2018 | Manson | |
| 2021/0009004 A1* | 1/2021 | Tsutsumi | B60L 53/62 |
| 2021/0061123 A1* | 3/2021 | Suzuki | H01M 10/425 |
| 2021/0155100 A1* | 5/2021 | Khaligh | B60L 55/00 |
| 2022/0037926 A1* | 2/2022 | Omori | H02J 50/80 |
| 2022/0250498 A1* | 8/2022 | Okada | B60L 53/30 |

FOREIGN PATENT DOCUMENTS

| | | |
|---|---|---|
| GB | 919002 | 2/1963 |
| JP | H07146717 | 6/1995 |
| JP | 2007330083 | 12/2007 |
| WO | 2013/057516 A1 | 4/2013 |
| WO | 2019/046939 | 3/2019 |

\* cited by examiner

ENERGY SUPPLY SYSTEM

CROSS REFERENCE TO RELATED APPLICATION

This application claims priority under 35 USC 119 to German Patent Appl. No. 10 2020 129 250.3 filed on Nov. 6, 2020, the entire disclosure of which is incorporated herein by reference.

BACKGROUND

Field of the Invention

The invention relates to an energy supply system, to a vehicle and to a method for operating an energy supply system.

Related Art

Energy-saving houses and apartments may be capable of "island operation" in which, for example, the lighting and the refrigerator are supplied with electrical energy (e. g. alternating current) by a vehicle and the external power supply network is not connected. This enables electrical energy produced by a solar roof to be stored in the vehicle, and the energy stored in the vehicle subsequently can be used for private consumption in the house.

WO 2013/057516 A1 shows an intelligent meter for a household network and for consumers connected to the household network.

CN 107 612 044 A shows a switching method for island operation and network operation.

US 2016/0266559 A1 shows a method for reconnection of a micronetwork to a main network.

US 2018/0375338 A1 shows a system for selective synchronization.

WO 2019/046939 A1 shows a power node for a vehicle with synchronization.

An object of this invention is to provide an energy supply system, a vehicle for the energy supply system and a method for operating an energy supply system.

SUMMARY

An energy supply system in accordance with this disclosure has a control apparatus, a measurement apparatus, a switch unit, a charging station for a vehicle and a signal transmission apparatus. The switch unit has an on state and an off state. The switch unit that is in the on state connects first conductors of a first line to associated second conductors of a second line. The switch unit that in in the off state disconnects the first conductors of the first line from the associated second conductors of the second line. The charging station is connected electrically to the first line and is designed as a bidirectional charging station to enable energy transmission from the charging station to a vehicle in a charging mode and to enable energy transmission from a vehicle to the charging station in a feed-in mode. The measurement apparatus is set up to determine at least one phase difference value characterizing the phase difference between a first AC voltage signal at one of the first conductors and a second AC voltage signal at one of the second conductors. The control apparatus is set up to output a first command by means of the signal transmission apparatus depending on the phase difference value. The first command enables a vehicle connected to the charging station to change the phase position of a fed-in AC voltage signal in the feed-in mode to reduce the phase difference. Additionally, the control apparatus is set up to enable a first change of state of the switch unit from the off state to the on state.

Phase adjustment can take place in the feed-in mode while feeding into the energy supply system, and the energy supply system subsequently can be coupled to the supply network by means of the switch arrangement. Disconnection of the vehicle from the first line before the connection of an external supply network is not necessary and therefore the risk of device malfunctions in the case of consumers fed from the energy supply system is reduced.

In some embodiments, the control apparatus is configured to carry out the first change of state depending on the phase difference value. The phase difference and hence the phase difference value determine the loading of the energy supply system when the external supply network is connected, and therefore this dependency is advantageous.

In some embodiments, the control apparatus is configured to carry out the first change of state at least during a prescribed first period of time only under the condition that the phase difference value corresponds to a phase difference that is smaller than a prescribed phase difference limit value. Thus, it is easy to connect the supply network when the phase difference is small.

The first command may comprise a piece of information about the absolute value of the phase shift and about the direction of the phase shift. Other than, for example, a direct time stipulation of the phase profile, such a command permits smooth adjustment and there are no high demands on the data transmission for the first command.

In some embodiments, the measurement apparatus is configured to identify phase difference values at prescribed time intervals, and the control apparatus is designed to output first commands by means of the signal transmission apparatus depending on the phase difference values. The prescribed time intervals can be prescribed as time intervals or in terms of time by corresponding demands of the control apparatus.

A vehicle in accordance with this disclosure has a bidirectional charging device, a vehicle communication apparatus and a control device. The vehicle is configured to generate an AC voltage by means of the bidirectional charging device in a feed-in mode and to transmit energy to a charging station. The control device is configured to receive a first command by means of the vehicle communication apparatus, and to carry out a phase shift of the generated AC voltage depending on the first command. The first command may comprise a piece of information about the absolute value of the phase shift and about the direction of the phase shift. The first command may originate from the energy supply system. Such a vehicle can carry out a desired change of the phase position during feed-in.

A method in accordance with this disclosure is used with an energy supply system that has a control apparatus, a measurement apparatus, a switch unit, a charging station for a vehicle and a signal transmission apparatus. The switch unit has an on state that connects first conductors of a first line to associated second conductors of a second line and has an off state that disconnects the first conductors of the first line from the associated second conductors of the second line. The charging station is connected electrically to the first line and is designed as a bidirectional charging station to enable energy transmission from the charging station to a vehicle in a charging mode and to enable energy transmission from a vehicle to the charging station in a feed-in mode. The method includes:

A) using the measurement apparatus for determining at least one phase difference value characterizing the phase difference between a first AC voltage signal at one of the first conductors and a second AC voltage signal at one of the second conductors;

B) outputting a first command by means of the signal transmission apparatus depending on the phase difference value, wherein first command enables a vehicle connected to the charging station to change the phase position of a fed-in AC voltage signal in the feed-in mode to reduce the phase difference; and C) using the control apparatus for changing a first change of state of the switch unit from the off state to the on state.

According to one embodiment, step A) is performed multiple times, and in step C) the first change of state is carried out depending on the phase difference value. This increases safety when connecting an external supply network.

According to one embodiment, in step C) the first change of state is carried out at least during a prescribed first period of time only under the condition that the phase difference value corresponds to a phase difference that is smaller than a prescribed phase difference limit value. A small phase difference leads to low losses during connection.

According to some embodiments, the first command comprises a piece of information about the absolute value of the phase shift and about the direction of the phase shift. This piece of information enables adjustment and at the same time the charging device of the vehicle has a certain degree of freedom as to how the phase shift is achieved. Time-critical or rapid data transmission is also not necessary for the first command.

Further details and advantageous refinements of the invention will emerge from the exemplary embodiments described below and illustrated in the drawings. These embodiments should in no way be understood as restricting the invention.

DETAILED DESCRIPTION

Identical or functionally identical parts are provided with the same reference signs below and are usually described only once. The description spans the figures such that these build on one another, in order to avoid unnecessary repetitions.

Figure 1:
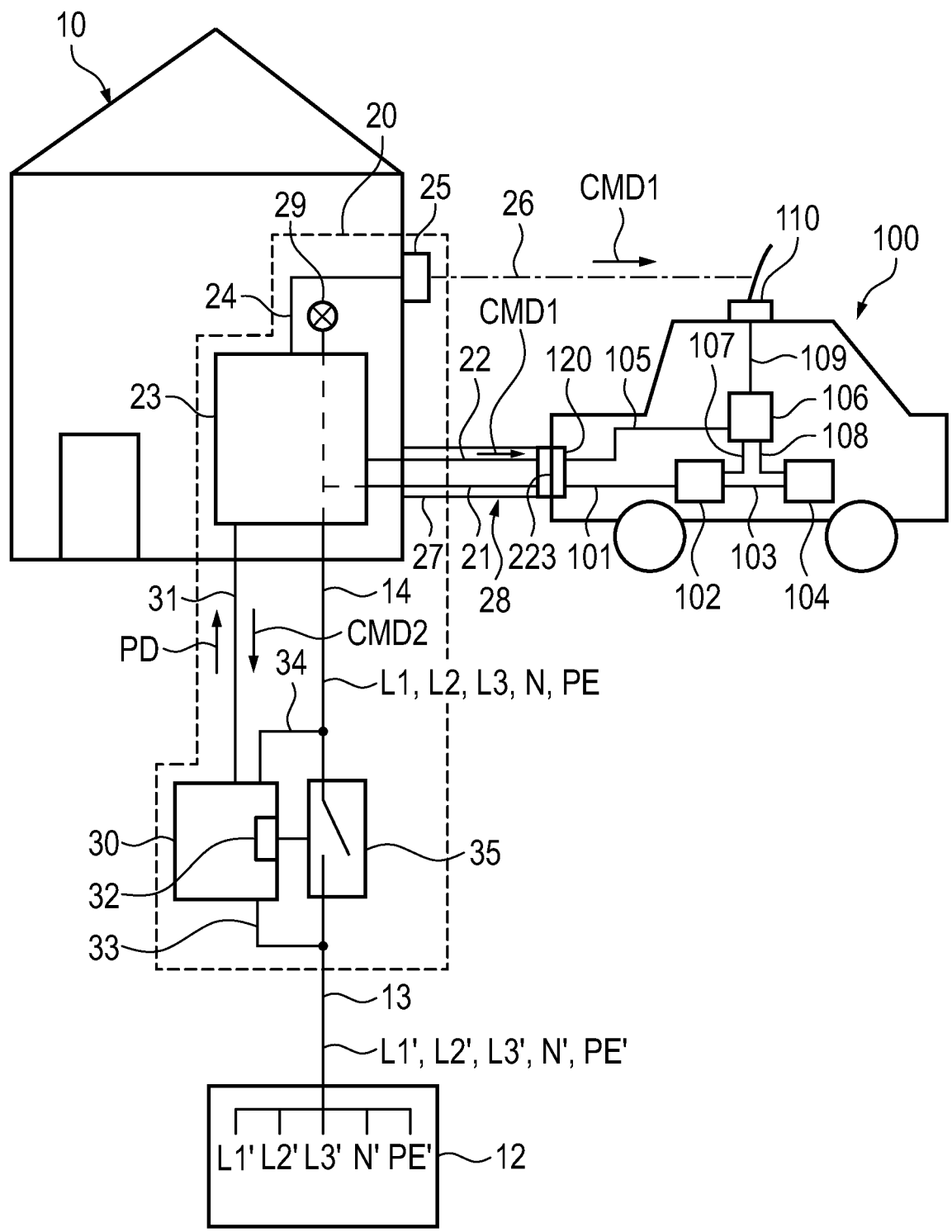
FIG. 1 is a schematic illustration of a vehicle connected to a domestic energy supply system by means of a charging cable and a supply network that can be connected to the domestic energy supply system.

FIG. 1 is a schematic illustration of a house 10, a vehicle 100 and a supply network 12. The house 10 has an energy supply system 20 with a control apparatus 23, a measurement apparatus 30, a switching apparatus 32, a switch unit 35, a charging station 28 for the vehicle 100 and a signal transmission apparatus 22 and 25.

The switch unit 35 is provided between a first line 14 and a second line 13. The first line 14 has five conductors, for example, which in the case of a three-phase supply network 12 are connected to the active conductors L1, L2, L3 and N (neutral conductor) as well as to a protective conductor PE. The second line 13 also has five conductors, for example, which in the case of a three-phase supply network 12 are connected to the active conductor phases L1', L2', L3', the active neutral conductor N' and the protective conductor PE'. The switch unit 35 is designed in an on state to connect the first conductors of the first line 14 to associated second conductors of the second line 13 and in an off state to disconnect the first conductors of the first line 14 from the associated second conductors of the second line 13. One switch preferably is provided for each of the conductors for this purpose. The switching apparatus 32 enables actuation of the switching unit 35. Three conductors (L1, N, PE) are sufficient for single-phase operation.

The measurement apparatus 30 is connected electrically to the first line 14 via a line 34 and to the second line 13 via a line 33. The lines 33 and 34 each preferably are connected at least to one of the conductors, by means of which an active conductor phase is transmitted, for example the active conductor phase L1 or L1'. The measurement apparatus 30 may include at least one sensor coupled to each of the at least one of the conductors, e.g., a voltage sensor, a voltage transformer, a potential transformer, etc., to sense a waveform on the corresponding line. The measurement apparatus 30 may further include at least one zero-crossing detector to determine when a particular waveform crosses a zero threshold. Additionally, the measurement apparatus 30 may include at least one clock and at least one comparator for comparing points of time or zero-crossings of voltage waveforms of the first line 14 and the second line 13 to determine a phase difference. The measurement apparatus 30 therefore can determine at least one phase difference value PD characterizing the phase difference between a first AC voltage signal at one of the first conductors L1, L2, L3 and a second AC voltage signal at one of the second conductors L1', L2', L3'. The measurement apparatus 30 is connected to the control apparatus 20 via a line 31. The phase difference value PD can be transmitted from the measurement apparatus 30 to the control apparatus 23 via the line 31, and a command CMD2 can be transmitted from the control apparatus 23 to the switching apparatus 32 to switch over the switch unit 35. The command CMD2 can be used to influence whether the switch unit 35 is in the on state or in the off state. The control apparatus 23 is connected to a wireless communication apparatus 25 via a line 24.

The control apparatus 23 can also be referred to as an HCM (home charge manager).

In the context of this disclosure, a "control apparatus" can be understood to include, for example, a processor and/or a storage unit or memory for storing algorithms and program commands. By way of example, the processor and/or the control apparatus 23 is specifically configured to carry out program commands in such a way that the processor and/or the control apparatus 23 carries out functions to implement or realize a method as disclosed herein or a step of a method as disclosed herein. The term control apparatus 23 is used here synonymously with devices known from the prior art. A control apparatus, therefore, encompasses a "computer" and accordingly comprises one or more general-purpose processors (CPUs) or microprocessors, RISC processors, GPUs and/or DSPs. The control apparatus or computer has for example additional elements such as storage interfaces of communication interfaces. Optionally or additionally, the terms "control apparatus" and "computer" refer to a device that is capable of executing a provided or included program, preferably with standardized programming language (for example C++, JavaScript or Python), and/or of controlling and/or accessing data storage devices and/or other devices such as input interfaces and output interfaces. The term computer also refers to a multiplicity of processors or a multiplicity of (sub)computers that are interconnected and/or connected and/or otherwise communicatively connected and possibly share one or more other resources, such as for example a memory.

The control apparatus 23 also is connected to a charging station 28, which in the illustrated embodiment has a charging cable 27 with an electrical line 21 and a signal line 22. The charging cable 27 has a charging cable connection 223 that is configured to connect to a vehicle connection 120 on the vehicle 100. A first line 101 runs from the vehicle connection 120 to a charging device 102, and a line 103 runs from the charging device 102 to a battery 104. A line 105 can be connected to the signal line 22 and runs to a control device 106. The control device 106 is connected to the charging device 102 via a line 107 and is connected to the battery 104 via a line 108. The control device 106 is connected to a vehicle-based wireless communication apparatus 110 via a line 109.

The charging device 202 preferably is of bidirectional design, and thus enables energy transmission in both directions (charging and feed-in, respectively). On the output side (toward the vehicle connection 120), the charging device preferably operates using an AC voltage at least in the feed-in mode. The charging device 202 preferably has a bidirectional AC/DC converter.

The control device 23 enables transmission of a first command CMD1 via the line 22 and, as an alternative, wireless transmission of the first command CMD1 via wireless signal transmission 26 between the wireless communication apparatus 25 of the energy supply system 20 and the vehicle-based wireless communication apparatus 110 of the vehicle 100. Powerline transmission via the line 21 is also possible, in which the signal is modulated onto the power voltage.

It is to be appreciated that the wireless communication apparatus 25 of the energy supply system 20 and the vehicle-based wireless communication apparatus 110 of the vehicle 100 may be a modem, network interface card (NIC), wireless transceiver, etc. The communication apparatuses 25, 110 may perform its functionality by wireless connectivity and the wireless connection may operate under any of the various wireless protocols including but not limited to Bluetooth™ interconnectivity, infrared connectivity, radio transmission connectivity including computer digital signal broadcasting and reception commonly referred to as Wi-Fi or 802.11.X (where x denotes the type of transmission), cellular transmission, PSC, satellite transmission or any other type of communication protocols, communication architecture or systems currently existing or to be developed for wirelessly transmitting data including spread spectrum 900 MHz, or other frequencies, Zigbee, WiFi, or any mesh enabled wireless communication.

In what is known as "island operation," it is possible to supply an AC voltage to the house 10 via the battery 104 and the bidirectional charging device 102. In this case, the charging device 102 generates the AC voltage, for example a single-phase AC voltage or a three-phase AC voltage, and the AC voltage is transmitted to or fed into the energy supply system 20 via the lines 101 and 21 and is therefore available in the house 10 and in particular at the first line 14 as an energy source, for example for lighting 29, for a dishwasher or for a refrigerator (not illustrated). In island operation, the house 10 is disconnected from the supply network 12; the switch unit 35 is thus switched off.

The supply network 12 is connected if, for example, more energy is required or if the battery 104 of the vehicle 100 is discharged to a greater extent. The frequency of the AC voltage of the supply network 12 and also the frequency of the AC voltage of the charging device 102 are the same and in Europe are 50 Hz, for example. However, if the switch unit 35 is switched on, even though for example the active conductor phase L1 at the first line 14 has a greater phase shift with respect to the active conductor phase L1' at the second line 13, high currents flow when the two networks are coupled, which can lead to electrical losses or to damage.

In a first step, the phase difference value PD can be identified by the measurement apparatus 30 and transmitted to the control apparatus 23. The control apparatus 23 can subsequently transmit the first command CMD1 to the vehicle 100 and the vehicle 100 can change the phase position of the fed-in AC voltage signal over the ongoing feed-in depending on the first command CMD1 to reduce the phase difference. Active phase synchronization can be achieved as a result. This can be advantageous both in the case of V2H (vehicle to home) and in the case of V2G (vehicle to grid).

An advantage of the transmission of the first command CMD1 is that the transmission can be slow or can take place with great latency. The vehicle 100 can carry out the change of the phase position and can select a transmission suitable for the respective vehicle for this purpose. It may thus be advantageous for specific vehicles 100 or energy supply systems 20 when the frequency for phase adjustment is changed only slightly and over a relatively long period of time for this purpose, for example in the range of 50 Hz±2 Hz. With other vehicles, a greater change in frequency can be selected, for example 50 Hz±20 Hz.

The control device 23 also can observe the phase difference by identifying further phase difference values PD and switch the switch unit 35 on as soon as the phase difference is low enough.

The vehicle 100 receives the first command CMD1 and the control device 106 can influence the charging device 102 depending on this command CMD1 in such a way that the phase position of the AC voltage generated by the charging device 102 is changed according to the first command CMD1. To this end, for example, the period length of the generated AC voltage can be increased or decreased by virtue of the frequency being decreased or increased.

Figure 2:
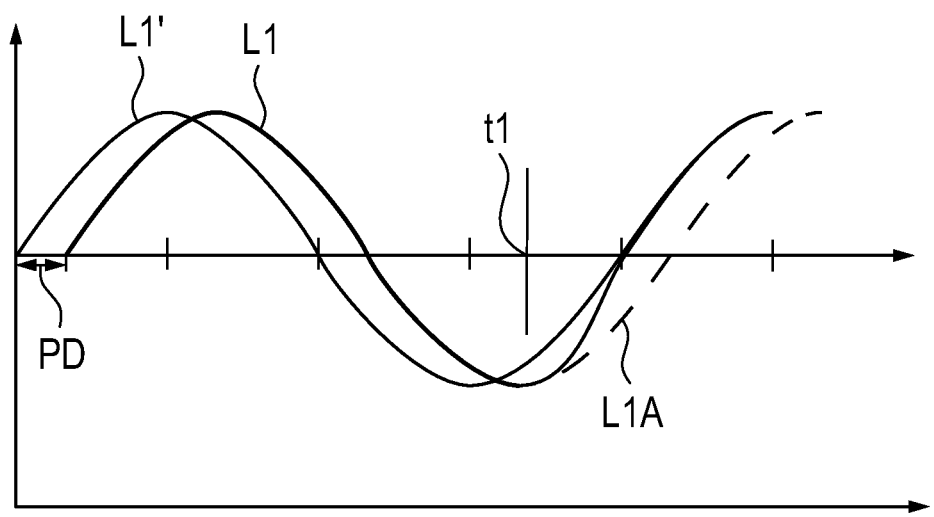
FIG. 2 is a schematic illustration of an adjustment of the phase position of an AC voltage generated by the vehicle of FIG. 1.

FIG. 2 is a schematic illustration of the active conductor phase L1 that is generated by the charging device 102 of the vehicle 100, and the active conductor phase L1' at the second line 13, which is prescribed by the supply network 12. The phase difference PD is marked. The phase position of the active conductor phase L1' of the supply network 12 cannot be influenced by the energy supply system 20 and therefore the phase position of the active conductor phase L1 has to be adjusted.

In the case shown, the active conductor phase L1 leads by a phase angle of approximately 30° or by a period of time of 1.67 ms or by 8.33% of a period and can be forwarded −30° or −1.67 ms or −8.33% as first command CMD1. The direction of the phase adjustment can thus be specified by the sign.

The charging device receives the first command CMD1 at the time t1 and in response the frequency is increased for a prescribed period of time to achieve a corresponding phase shift and as a result to bring about a reduction in the phase difference PD. The signal L1A shows the active conductor phase without the phase shift. The adjustment illustrated is effected in the exemplary embodiment over a very short period of time of less than a quarter of the period duration. This can lead to problems in electronic devices and therefore the adjustment is preferably effected over a longer period of time.

Figure 3:
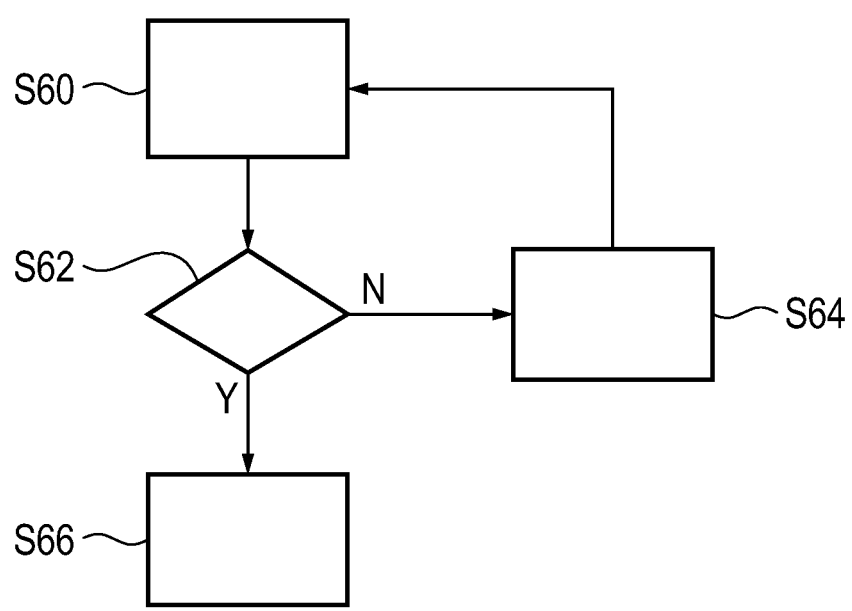
FIG. 3 is a flowchart of a method for operating the energy supply system of FIG. 1.

FIG. 3 shows a flowchart with a possible method for operating the energy supply system 20. In a step S60, a measurement is carried out by the measurement apparatus 30 and at least one phase difference value PD characterizing the phase difference between a first AC voltage signal L1 at the first line 14 and a second AC voltage signal line L1' at the second line 13 is determined.

Subsequently, there is a jump back to S62 and a check is carried out there to determine whether the phase difference value PD corresponds to a phase difference that is smaller than a prescribed phase difference limit value, for example 5°. This check can be carried out in terms of absolute value or different limit values can be stipulated for positive and negative phase differences.

If the phase difference is small enough in terms of absolute value, there is a jump back to S66 and a first change in state of the switch unit 35 from the off state to the on state is carried out by the control apparatus 23.

If, in contrast, in S62 the phase difference is too great, there is a jump back to S64 and a first command CMD1 is forwarded to the vehicle 100. There is a jump back to S60 after a prescribed period of time and the phase difference value PD is measured and identified again.

Optionally, in S62 there may be an additional check to determine whether a prescribed period of time has elapsed since the first request of step S60 and, in this case, there is also a jump back to S66 despite a phase difference PD that is greater than the phase difference limit value. In such a case, however, the vehicle 100 preferably is disconnected from the charging station 28 in advance. Through these measures, even vehicles 100 that do not have the option of adjusting the phase position can be used for island operation.

Numerous variations and modifications are of course possible within the scope of the present invention.

What is claimed is:

1. An energy supply system comprising: a control apparatus, a measurement apparatus, a switch unit, a charging station for a vehicle and a signal transmission apparatus,
   the switch unit being designed so that, in an on state, the switch unit connects first conductors of a first line to associated second conductors of a second line and in an off state disconnects the first conductors of the first line from the associated second conductors of the second line,
   the charging station being connected electrically to the first line and being a bidirectional charging station to enable energy transmission from the charging station to a vehicle in a charging mode and to enable energy transmission from a vehicle to the charging station in a feed-in mode,
   the measurement apparatus being configured to determine at least one phase difference value characterizing the phase difference between a first AC voltage signal at one of the first conductors and a second AC voltage signal at one of the second conductors,
   the control apparatus being configured to output a first command by means of the signal transmission apparatus depending on the phase difference value, the first command enabling a vehicle connected to the charging station to change the phase position of a fed-in AC voltage signal in the feed-in mode in order to reduce the phase difference, and the control apparatus further being configured to enable a first change of state of the switch unit from the off state to the on state,
   wherein the control apparatus is configured to carry out the first change of state depending on the chase difference value.

2. An energy supply system comprising: a control apparatus, a measurement apparatus, a switch unit, a charging station for a vehicle and a signal transmission apparatus,
   the switch unit being designed so that, in an on state, the switch unit connects first conductors of a first line to associated second conductors of a second line and in an off state disconnects the first conductors of the first line from the associated second conductors of the second line,
   the charging station being connected electrically to the first line and being a bidirectional charging station to enable energy transmission from the charging station to a vehicle in a charging mode and to enable energy transmission from a vehicle to the charging station in a feed-in mode,
   the measurement apparatus being configured to determine at least one phase difference value characterizing the phase difference between a first AC voltage signal at one of the first conductors and a second AC voltage signal at one of the second conductors,
   the control apparatus being configured to output a first command by means of the signal transmission apparatus depending on the phase difference value, the first command enabling a vehicle connected to the charging station to change the phase position of a fed-in AC voltage signal in the feed-in mode in order to reduce the chase difference, and the control apparatus further being configured to enable a first change of state of the switch unit from the off state to the on state, wherein the control apparatus is configured to carry out the first change of state at least during a prescribed first period of time only under the condition that the phase difference value corresponds to a phase difference that is smaller than a prescribed phase difference limit value.

3. An energy supply system comprising: a control apparatus, a measurement apparatus, a switch unit, a charging station for a vehicle and a signal transmission apparatus,
   the switch unit being designed so that, in an on state, the switch unit connects first conductors of a first line to associated second conductors of a second line and in an off state disconnects the first conductors of the first line from the associated second conductors of the second line,
   the charging station being connected electrically to the first line and being a bidirectional charging station to enable energy transmission from the charging station to a vehicle in a charging mode and to enable energy transmission from a vehicle to the charging station in a feed-in mode,
   the measurement apparatus being configured to determine at least one phase difference value characterizing the phase difference between a first AC voltage signal at one of the first conductors and a second AC voltage signal at one of the second conductors,
   the control apparatus being configured to output a first command by means of the signal transmission apparatus depending on the phase difference value, the first command enabling a vehicle connected to the charging station to change the phase position of a fed-in AC voltage signal in the feed-in mode in order to reduce the phase difference, and the control apparatus further being configured to enable a first change of state of the switch unit from the off state to the on state, wherein the first command comprises information about an absolute value of the phase shift and about a direction of the phase shift.

4. The energy supply system of claim 1, wherein the measurement apparatus is configured to identify phase difference values at prescribed time intervals, and wherein the control apparatus is designed to output first commands by means of the signal transmission apparatus depending on the phase difference values.

5. A method for operating the energy supply system of claim 1, the method comprising:
  using the measurement apparatus for determining at least one phase difference value characterizing the phase difference between a first AC voltage signal at one of the first conductors and a second AC voltage signal at one of the second conductors;
  using the signal transmission apparatus for outputting a first command depending on the phase difference value, the first command enabling a vehicle connected to the charging station to change the phase position of a fed-in AC voltage signal in the feed-in mode in order to reduce the phase difference; and
  using the control apparatus to carry out a first change of state of the switch unit from the off state to the on state.

6. The method of claim 5, wherein
  the step of using the measurement apparatus for determining at least one phase difference value characterizing the phase difference between a first AC voltage signal at one of the first conductors; and a second AC voltage signal at one of the second conductors is performed multiple times, and
  the step of using the control apparatus to carry out a first change of state of the switch unit from the off state to the on state is carried out depending on the phase difference value.

7. The method of claim 6, wherein the step of using the control apparatus to carry out a first change of state of the switch unit from the off state to the on state is carried out at least during a prescribed first period of time only under the condition that the phase difference value corresponds to a phase difference that is smaller than a prescribed phase difference limit value.

8. The method of claim 5, wherein the first command comprises a piece of information about an absolute value of the phase shift and about a direction of the phase shift.

9. The energy supply system of claim 1, wherein the measurement apparatus is configured to identify phase difference values at prescribed time intervals, and wherein the control apparatus is designed to output first commands by means of the signal transmission apparatus depending on the phase difference values.

10. The energy supply system of claim 2, wherein the measurement apparatus is configured to identify phase difference values at prescribed time intervals, and wherein the control apparatus is designed to output first commands by means of the signal transmission apparatus depending on the phase difference values.

* * * * *